United States Patent [19]

Ohsaki

[11] Patent Number: 5,465,231
[45] Date of Patent: Nov. 7, 1995

[54] EEPROM AND LOGIC LSI CHIP INCLUDING SUCH EEPROM

[76] Inventor: Katsuhiko Ohsaki, 1963-1 Misono Ritto-cho, Kurita-gun Shiga-ken, Japan

[21] Appl. No.: 239,078

[22] Filed: May 6, 1994

[30] Foreign Application Priority Data

May 7, 1993 [JP] Japan .................................. 5-106635

[51] Int. Cl.$^6$ .................................................. G11C 11/40
[52] U.S. Cl. .................. 365/185.33; 257/315; 257/316; 257/318; 365/182
[58] Field of Search .................................. 365/182, 185; 257/315, 316, 318, 368, 369

[56] References Cited

U.S. PATENT DOCUMENTS

| | | | |
|---|---|---|---|
| 4,649,520 | 3/1987 | Eitan | 365/185 |
| 4,661,833 | 4/1987 | Mizutani | 365/185 X |
| 4,970,565 | 11/1990 | Wu | 257/318 |
| 5,301,150 | 4/1994 | Sullivan | 365/185 |

Primary Examiner—David C. Nelms
Assistant Examiner—Son Mai

[57] ABSTRACT

Disclosed is an EEPROM cell which can be manufactured with ease by the standard CMOS process. The EEPROM cell of the present invention has a first MOS transistor formed in a semiconductor substrate of a first conductivity type and having current conducting regions of a second conductivity type and a gate electrode, a well of a second conductivity type provided in the substrate, a plate electrode formed on the well with an insulating layer interposed therebetween, and at least one region of the first conductivity type formed in the well adjacent to the plate electrode. The gate electrode and the plate electrode are connected in common and act as a floating gate, and the well acts as a control gate.

9 Claims, 6 Drawing Sheets

EEPROM AND LOGIC LSI CHIP INCLUDING SUCH EEPROM

FIELD OF THE INVENTION

The present invention relates to an electrically erasable and programmable read only memory (EEPROM) using the CMOS technology and a CMOS logic LSI chip incorporating such EEPROM.

BACKGROUND OF THE INVENTION

Non-volatile random access memories (RAM's) are used in various systems. For example, they are used as a system configuration data memory in personal computer, a data register for suspend/resume function, a program memory for error checking, and a data memory for IC card. The memory capacity required for such non-volatile memories is not very large and may often be sufficient to range from several kilobits to several hundreds kilobits.

When such a non-volatile RAM of a small capacity and a logic LSI such as a gate array or a microprocessor can be formed together in the same semiconductor substrate, production costs and the size of the device can be greatly reduced. However, due to the difference between the respective production processes, it is difficult to form them in a mixed manner together in the same semiconductor substrate. For example, a typical non-volatile RAM is an EEPROM memory of stacked gate structure in which a floating gate and a control gate are stacked, but such a memory cannot be manufactured through the standard complementary metal oxide semiconductor (CMOS) logic LSI process. That is because the standard CMOS process employs a one-layer polysilicon deposition step whereas the ordinary stacked gate ROM's require two polysilicon deposition steps for the floating gate and control gate. The ordinary stacked gate ROM's further require a step of depositing a very thin oxide layer between the two gates that is not used in the standard CMOS process.

Consequently, it was conventional in the prior art to form the non-volatile RAM and logic LSI in separate chips which are subsequently combined, or to modify the standard logic LSI process to allow the non-volatile RAM and logic LSI to be formed on the same chip. However, these methods are costly. Modifying the standard process also has a drawback in that it not only complicates the process but also requires strict process control.

Japanese Published Unexamined Patent Application ( PUPA ) 3-101168 discloses a non-volatile memory with a low power consumption formed through the CMOS process. In this patent application, between a program bit line and a ground potential are connected in series a first PMOS transistor, a second PMOS transistor, and an NMOS transistor. A floating gate is formed by the gates of the second PMOS and the NMOS transistors which are connected in common. The gate of the first PMOS transistor is connected to a word line. The common junction between the second PMOS and the NMOS transistors is connected to a read bit line. When writing data, the program bit line and the word line are simultaneously selected to turn on the first PMOS so that the positive potential on the program bit line is coupled to the second PMOS transistor. In this state, the floating gate and the drain of the NMOS transistor assume a positive potential and inject hot electrons into the floating gate.

However, the method disclosed in PUPA 3-101168 is not practical. That is, to generate hot electrons in the NMOS transistor, a high voltage must be applied to the drain of the NMOS transistor. However, since the NMOS transistor is connected in series with the two PMOS transistors which inherently have low conductance, a considerably large voltage must be applied to the program bit line to generate a required voltage at the drain of the NMOS. On the other hand, widening the channel width and thus enlarging the device size to increase conductance results in a larger gate capacitance of the PMOS transistors. The voltage of the floating gate is determined by the gate capacitance ratio of the PMOS to the NMOS transistor. Thus an increase in the gate capacitance of the PMOS transistor raises the floating gate voltage. As a result, the conduction of the PMOS falls, and the drain voltage of the NMOS falls. Consequently, the technique disclosed in the above patent application requires, in practice, not only a large writing voltage but also the fulfillment of contradictory requirements and thus is not practical. Besides, three FET's per cell are required.

SUMMARY OF THE INVENTION

Accordingly, an object of the present invention is to provide an EEPROM cell that can be easily manufactured through the standard CMOS process.

Another object of the invention is to provide an EEPROM array using such EEPROM cells.

Still another object of the invention is to provide a CMOS logic LSI chip incorporating such EEPROM cells.

An EEPROM cell according to the present invention comprises a first MOS transistor formed in a semiconductor substrate of a first conductivity type and having current conducting regions of a second conductivity type and current gate electrode, a well of the second conductivity type formed in the substrate, a plate electrode formed on the well with an insulating layer interposed therebetween, and at least one region of the first conductivity type formed in the well adjacent to the plate electrode. The gate electrode of the first MOS transistor and the plate electrode are commonly connected and serve as a floating gate. The well serves as a control gate. The well and the at least one region of the first conductivity type are connected to a word line. One of the current conducting regions (drain region) of the first MOS transistor is connected to a bit line whereas the other current conducting region (source region) is connected to a ground line.

The above at least one region of the first conductivity type can be provided by a second MOS transistor formed in the well. In this case, the above at least one region of the first conductivity type is provided by at least one current conducting region of the second MOS transistor whereas the above plate electrode is provided by the gate electrode of the second MOS transistor.

The EEPROM array of the present invention is constituted as an array of the above EEPROM cells arranged in rows and columns. A word line is provided for each cell row and is commonly connected to the wells and the regions of the first conductivity type in its associated cell row. Each of at least some of the bit lines is shared by a pair of cell columns and is commonly connected to one current conducting regions of the first MOS transistors in its associated pair of cell columns. Each of at least some of the ground lines is shared by a pair of columns connected to different bit lines and is commonly connected to the other current conducting regions of the first MOS transistors in its associated pair of cell columns.

The MOS logic LSI chip according to the present invention incorporates such an EEPROM array in a portion thereof.

In the EEPROM cell according to the present invention, the combination of the gate electrode of the first MOS transistor and the plate electrode commonly connected to each other serves as a floating gate, and the well serves as a control gate. Strictly speaking, the combination of the well and the at least one region of the first conductivity type therein will serve as a control gate, but the well mainly plays the function of the control gate, whereas the at least one region of the first conductivity type serves as a carrier source for facilitating the formation of an inversion layer. In the absence of the at least one region of the first conductivity type serving as a carrier source, a depletion layer may be formed at the surface of the well below the plate electrode at the time of writing, thereby inducing a resistance leading to a voltage loss. Consequently, a large write voltage becomes necessary and thus it is preferable to provide the at least one region of the first conductivity type in the well.

In the memory cell according to the present invention, the plate electrode serves as one of the capacitor electrodes while the inversion layer generated in the substrate surface in the well region serves as the other capacitor electrode. In the first MOS transistor, the gate electrode serves as one of the capacitor electrodes while the inversion layer in the substrate surface serves as the other capacitor electrode. Data can be written by hot electron injection or by Fowler-Nordheim (FN) tunneling injection. In the case of hot electron injection, a voltage is applied between the current conducting regions of the first MOS transistor, and a selected word line is energized. The word line voltage (write voltage) is capacitively coupled to the floating gate such that a voltage appears on the floating gate which is dependent on the capacitance ratio of these capacitors. The first MOS transistor is biased to a conductive state, and carriers are injected into the gate electrode of the first MOS transistor. In the case of FN tunneling, the current conducting regions of the first MOS transistor are grounded and a selected word line is energized.

The number, position, and shape of the at least one region of the first conductivity type formed in the well may be arbitrary as long as it is formed in the well adjacent to the plate electrode so as to be capable of serving as a carrier source. For example, the carrier source region may be formed as one or more rectangular regions adjacent to the well region where the inversion layer is to be formed, or may be formed as a ting-like or a frame-like region partially or entirely enclosing the well region. In addition, the cartier source of the first conductivity type may positionally overlap the plate electrode. If a second MOS transistor is formed in the well with its current conducting regions being used as the cartier source of the first conductivity type and its gate electrode as the plate electrode, the carrier source and plate electrode can be formed in exactly the same way as the CMOS transistors of the logic LSI. Although the well and the at least one region of the first conductive type need not necessarily be commonly connected to the same potential, it is preferable that they be commonly connected to each other to simplify the circuit and prevent the breakdown of the PN junction within the well.

According to the present invention, an EEPROM functionally equivalent to the conventional stacked gate type EEPROM can be formed through the standard CMOS process. Consequently, the EEPROM and logic section such as a gate array or a microprocessor can be easily mixed together on one chip. Furthermore, two MOS transistors can form one cell. The EEPROM according to the present invention, though lower in integration density than the stacked gate type EEPROM, gives rise to no problems in terms of the used chip area because it is generally used for applications requiring relatively small memory capacity.

DETAILED DESCRIPTION OF THE PREFERRED EMBODIMENT

The EEPROM cell according to the present invention comprises an NMOS transistor and a PMOS transistor with their polysilicon gates connected in common. The general construction of an embodiment of this EEPROM cell is shown in FIGS. 1 and 2.

Figure 1:
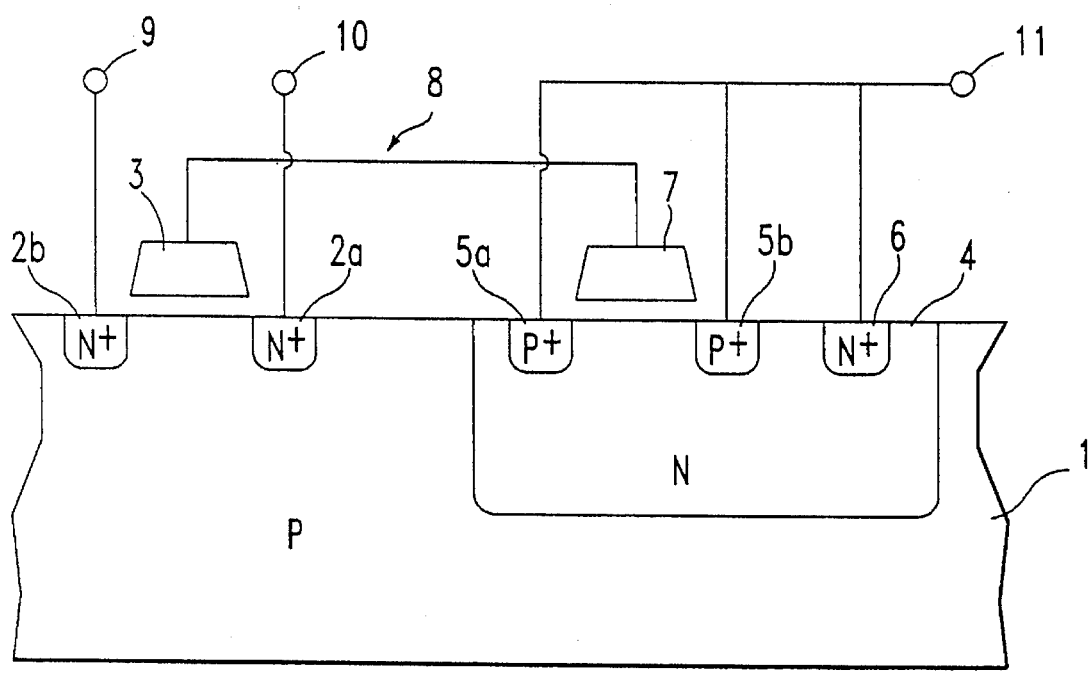
FIG. 1 is a schematic view illustrating the general configuration of one embodiment of the EEPROM cell according to the present invention.
Figure 2:
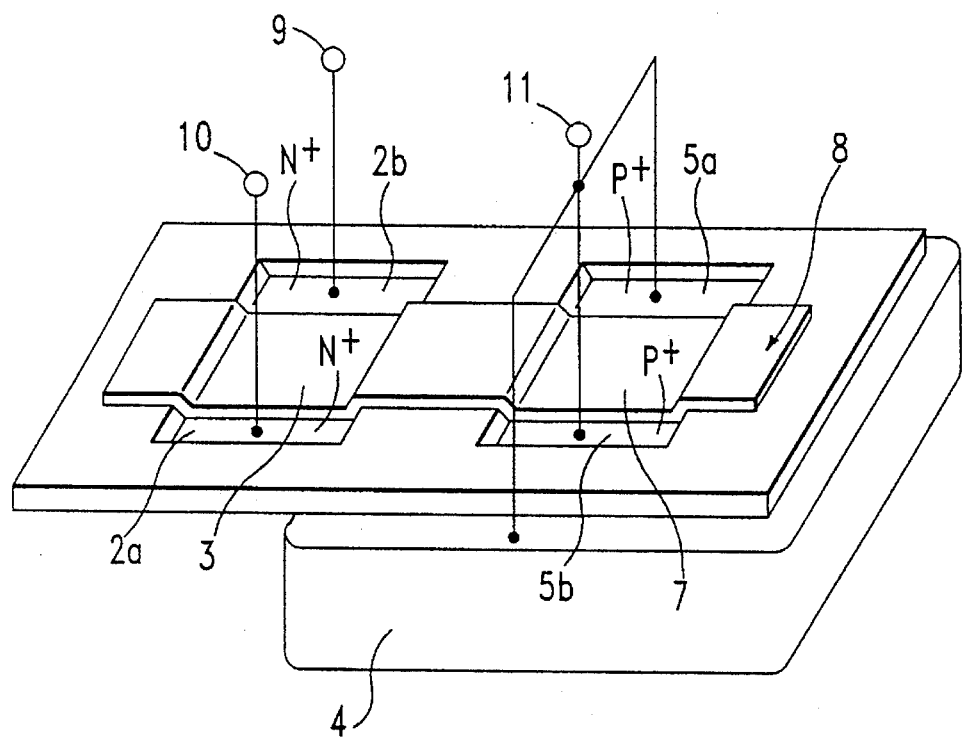
FIG. 2 is a perspective view illustrating the general configuration of the EEPROM cell shown in FIG. 1.

Referring to FIGS. 1 and 2, reference number 1 is a P-type semiconductor substrate, 2 and 3 are elements constituting an NMOS transistor; 2a is an $N^+$ diffusion source region, 2b is an $N^+$ diffusion drain region, and 3 is a gate electrode. A gate oxide film (not shown in the drawing) is formed between the gate electrode 3 and the semiconductor substrate 1. Reference number 4 is an N well. Furthermore, reference number 5a, 5b, 6, and 7 are elements constituting a PMOS transistor; 5a and 5b are $P^+$ diffusion regions corresponding to the source/drain regions of the PMOS transistor, 6 is an $N^+$ diffusion region serving as a well contact, and 7 is a plate electrode. A gate oxide film (not shown in the drawings) is formed between the plate electrode 7 and the N well 4. As shown in FIG. 1, the gate electrode 3 and plate electrode 7 are commonly connected to form a floating gate 8. As shown in FIG. 2, the gate electrode 3 of the NMOS transistor and the plate electrode 7 of the PMOS transistor can be formed as a continuous polysilicon electrode 8. Furthermore, reference number 9 is a drain terminal and 10 is a source terminal. The $N^+$ region serving as a well contact and the $P^+$ regions 5a and 5b are commonly connected to a control gate terminal 11.

WRITE OPERATION

The write operation for the EEPROM cell may be performed by NMOS channel hot electron injection (NCHE) and NMOS FN tunneling (NFN).

Figure 3:
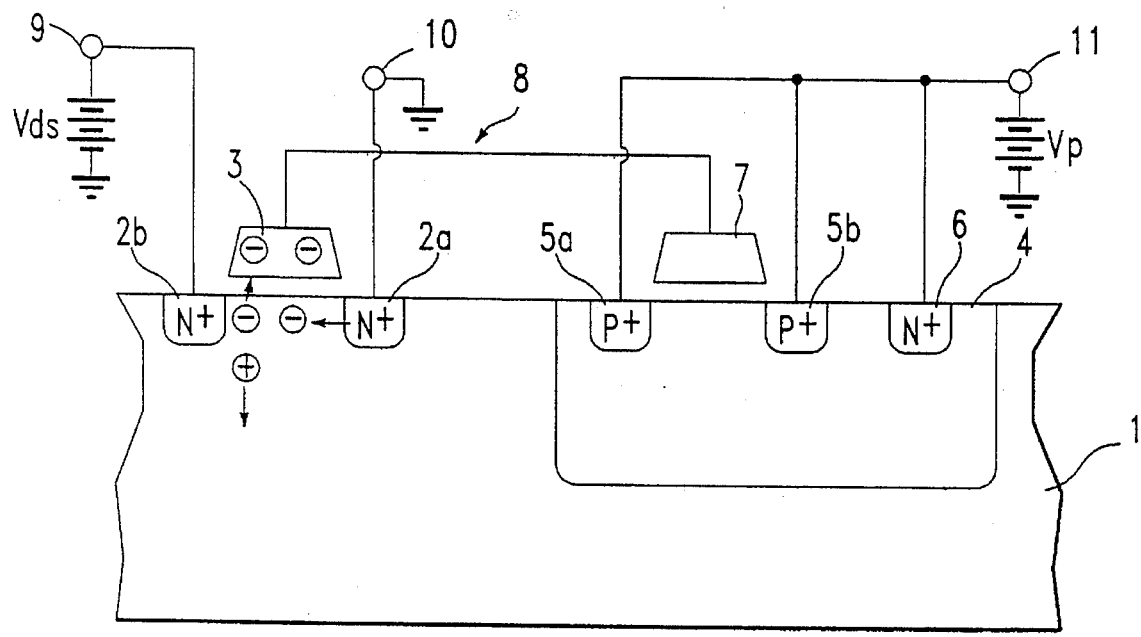
FIG. 3 is a view illustrating the write operation by hot electron injection of the EEPROM cell according to the present invention.

First, the NCHE writing operation will be described with reference to FIG. 3. The terminal 10 is held at a ground level or 0 V, the terminal 9 is held at a positive medium voltage level Vds, and the control node, or control terminal 11 is held at a positive high voltage level Vp. In this state, an inversion layer is formed at the interface between the N well 4 and the gate oxide film. In addition, an inversion layer is formed at the interface between the P-type semiconductor substrate 1 and the gate oxide film. At this time, a positive high voltage determined by the ratio of a capacitance Cgp between the former inversion layer and plate electrode 7 to a capacitance Cgn between the latter inversion layer and the gate electrode 3 is generated in the gate electrode 3. Consequently, the NMOS transistor is rendered highly conductive, and a high electric field occurs in the neighborhood of the N$^+$ diffusion drain region 2b, thereby generating hot electrons. Electrons accelerated by the electric field are injected from the N$^+$ diffusion drain region 2b into the gate electrode 3 with the result that the gate electrode 3 is negatively charged, and the plate electrode 7 connected to the gate electrode 3 is also negatively charged. Since the floating gate 8 comprising the gate electrode 3 and plate electrode 7 are electrically insulated from other elements, such a charged state is held for a long time.

Figure 4:
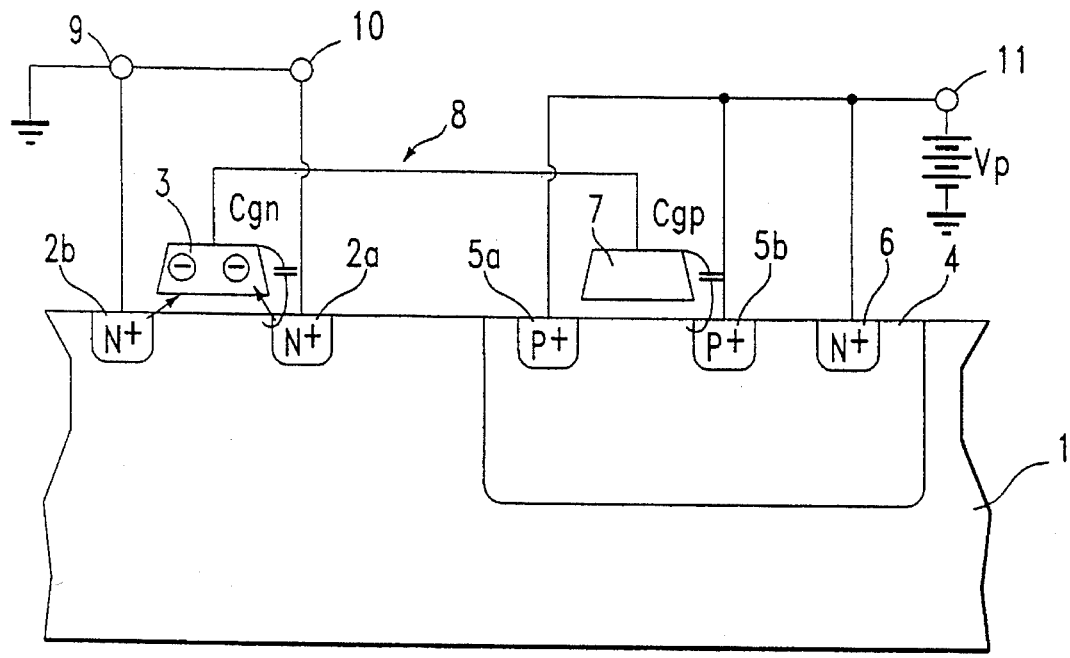
FIG. 4 is a view illustrating the write operation by FN tunneling of the EEPROM cell according to the present invention.

Next, NFN writing will be explained. As shown in FIG. 4, the terminals 9 and 10 are grounded while a high voltage (Vp) is applied to the terminal 11. This writing method may be adopted when the gate capacitance ratio (Cgp/Cgn ratio) is larger than 2 or 3. In such state, FN tunneling occurs at the NMOS gate oxide film. Electrons are injected from the N$^+$ diffusion regions 2a and 2b into the gate electrode 3. The number of injected electrons is determined by the Vp and Cgp/Cgn Ratio and represented as a linear function of Vp. Consequently, this operation can be used for storing analog data.

READ OPERATION

Figure 5:
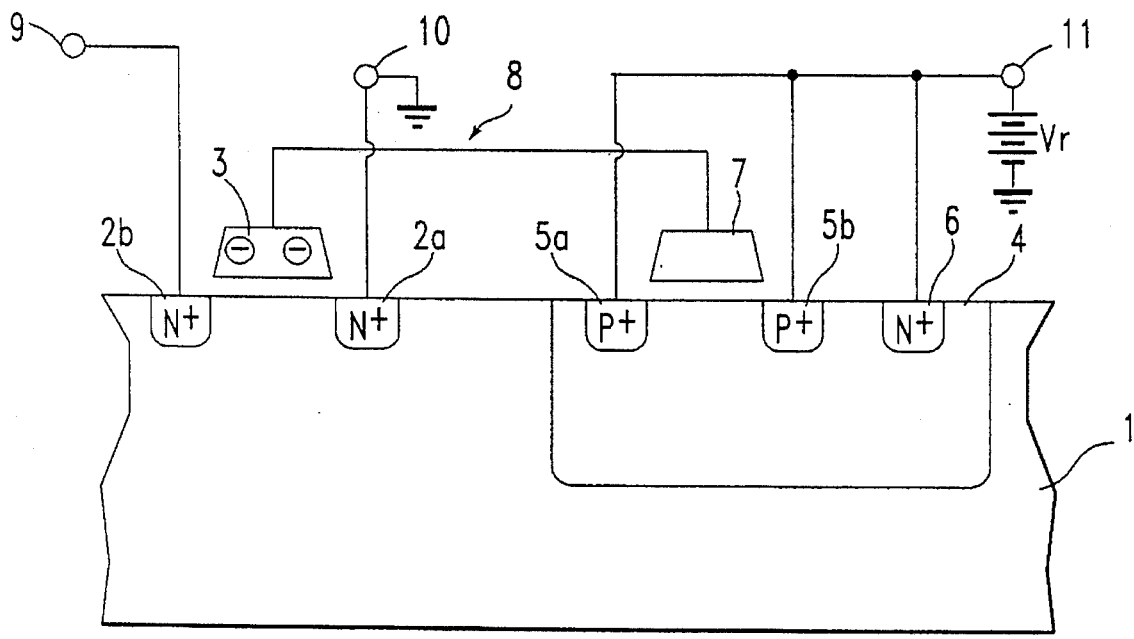
FIG. 5 is a view illustrating the read operation of the EEPROM according to the present invention.

The principle of the data read operation will be explained with reference to FIG. 5. The electrical conductivity of the NMOS transistor varies with the amount of negative charge on the floating gate electrode 8. During data reading, the terminal 10 is grounded, the terminal 9 is precharged to a medium voltage, and a medium voltage is applied to the terminal 11. In the absence of negative charge at the floating gate, a voltage dependent on the gate capacitance ratio appears at the gate electrode 3, thereby forming an inversion layer at the interface between the P-type semiconductor substrate 1 and the gate oxide film. Consequently, a conductive state is generated between the N$^+$ diffusion source region 2a and the N$^+$ diffusion drain region 2b, and the NMOS transistor is turned on. Therefore, this state is detected as a variation in the potential at the terminal 9. On the other hand, when the floating gates 3 and 7 are negatively charged, no inversion layer is formed at the interface between the P-type semiconductor substrate 1 and the gate oxide film with the result that there is no electrical conduction between the N$^+$ diffusion source region 2a and the N$^+$ diffusion drain region 2b. Consequently, the NMOS transistor is off. This is detected by the potential of the terminal 9 not changing. Thus, data can be read by sensing the on/off state of the NMOS transistor.

ERASE OPERATION

Figure 6:
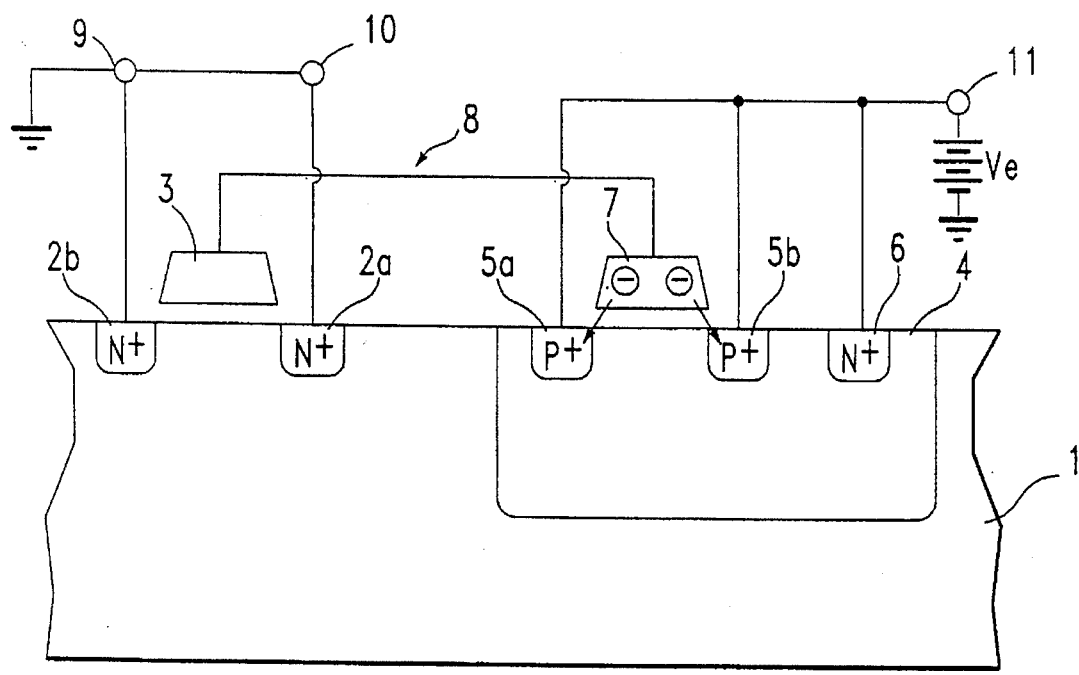
FIG. 6 is a view illustrating the erase operation by PMOS FN tunneling of the EEPROM cell according to the present invention.

The erase operation can be performed by FN tunneling at the PMOS gate (PFN) and by FN tunneling at the NMOS gate (NFN). The erase operation by FN tunneling at the PMOS gate will be explained with reference to FIG. 6. This erase operation may preferably be used when the Cgp/Cgn ratio is smaller than 1 (the PMOS transistor has a larger gate to substrate voltage than the NMOS transistor). In the opposite case, it will be preferable to use the erase operation shown in FIG. 7.

In the case of the erase operation by the PMOS gate FN tunneling, the terminals 9 and 10 are set at the ground level (namely 0 V) and when a high voltage Ve is applied to the terminal 11, a high electric field is generated between the floating gate 8 and the P$^+$ diffusion regions 5a and 5b to cause an FN tunnelling current to flow. Consequently, the charge of the floating gate 8 is removed and data is erased.

Figure 7:
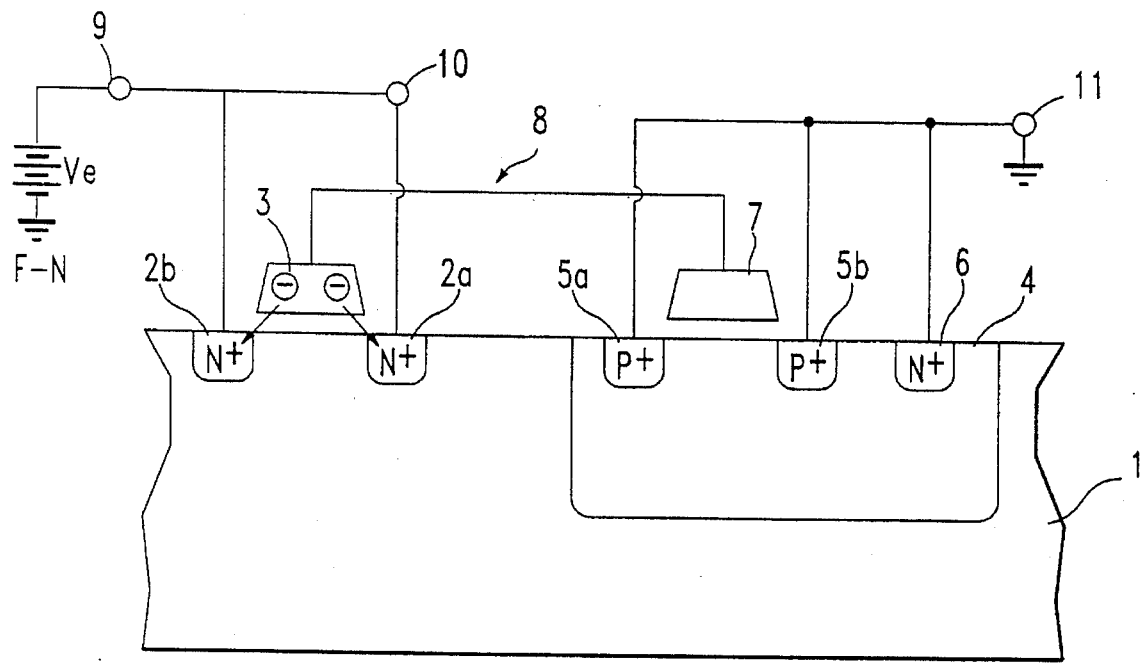
FIG. 7 is a view illustrating the erase operation by NMOS FN tunneling of the EEPROM cell according to the present invention.

Next, the erase operation by the NMOS gate FN tunneling will be explained with reference to FIG. 7. The control terminal 11 is placed at the ground level. A high voltage Ve is applied to the N$^+$ diffusions. A high electric field is produced between the floating gate 8 and the N$^+$ diffusion regions 2a and 2b to effect the FN tunneling. Consequently, the charge of the floating gate 8 is removed and data is erased.

The EEPROM cell based on the present invention having the above configuration is very compatible with the ordinary CMOS logic LSI structures and can be formed on the same chip along with a logic circuit or the like, without requiring special processing.

EEPROM ARRAY CIRCUIT

Figure 8:
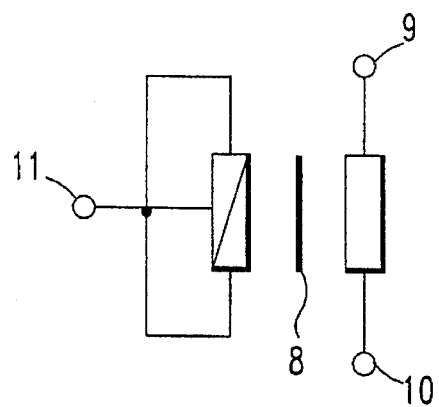
FIG. 8 is a symbol representation of the EEPROM cell according to the present invention.
Figure 9:
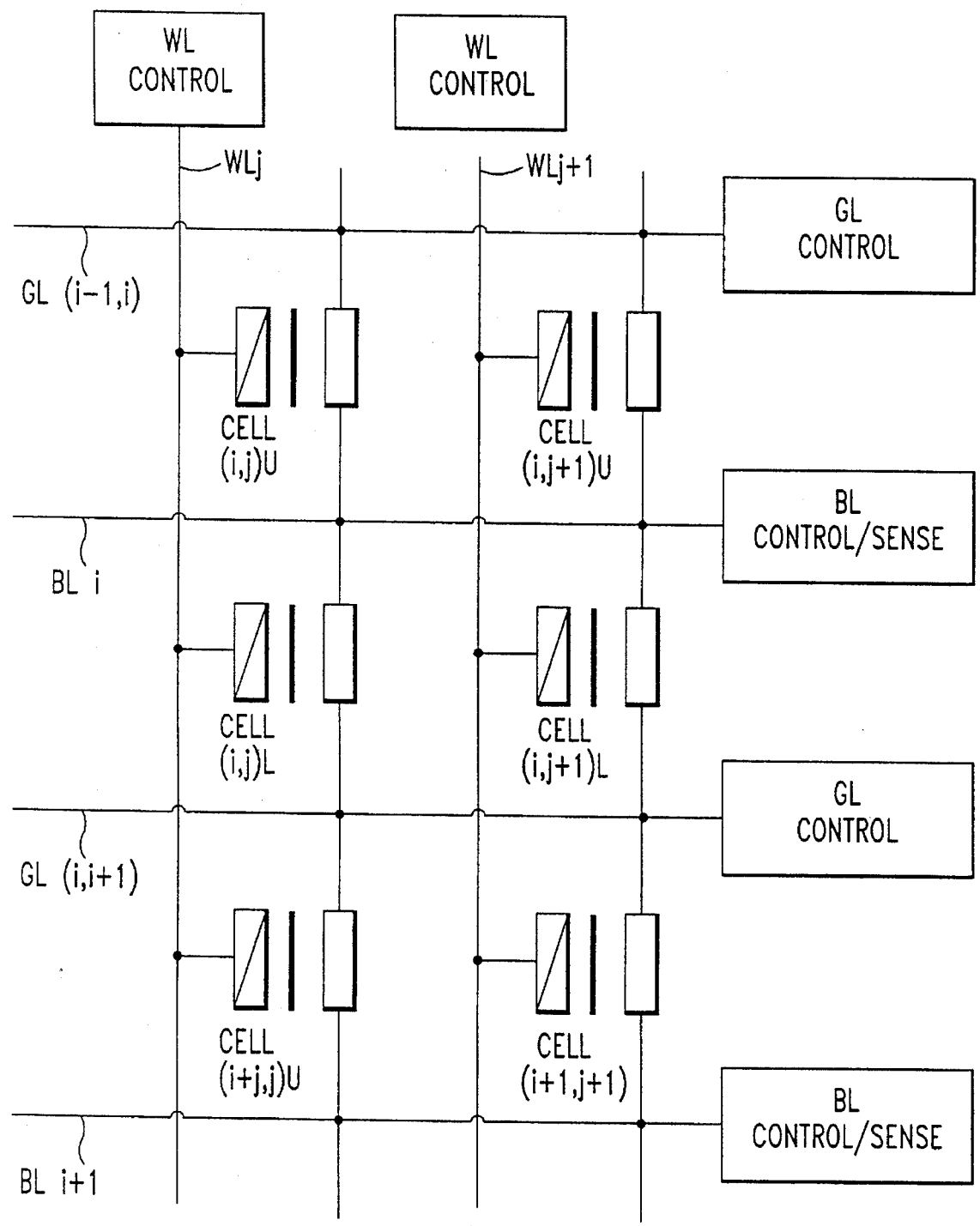
FIG. 9 is a partial circuit view illustrating the EEPROM array using the EEPROM according to the present invention.

The EEPROM cell according to the present invention can be represented with the symbol shown in FIG. 8. Referring to FIG. 8, reference numbers 8, 9, 10 and 11 are, respectively, the floating gate, the drain terminal, the source terminal, and the control gate terminal. FIG. 9 shows the basic configuration of one embodiment of an EEPROM array circuit in which the structure units (memory cells) are arranged in rows and columns.

In FIG. 9 two word lines WLj and WLj+1 are arranged in row direction. A plurality of memory cells are connected to each word line. The word line WLj is connected to the control gates of the memory cells (i, j) U, (i, j) L, and (i+1, j) U, whereas the word line WLj+1 is connected to the control gates of the memory cells (i, j+1) U, (i, j+1) L, and (i+1, j+1) U. Each word line is connected to a word line potential control circuit. Bit lines BLi and BLi+1 and ground lines GL (i−1, i) and GL (i, i+1) extend in column direction. The bit lines are connected to the drain terminals 9, and the ground lines are connected to the source terminals. Each of at least some of the bit lines, such as BLi, is shared by a pair of cell columns. Memory cells of the upper column of each pair of columns sharing a bit line are indicated by a letter U whereas the memory cells of the lower column are indicated by a letter L. Each of at least some of the ground lines is shared by two columns of memory cells connected to different bit lines. Each bit line is connected to a bit line potential control and sense circuit. And each ground line is connected to a ground line potential control circuit. In this connection, it is to be noted that the wells of the cells of each row may be formed as a single elongated region extending along the row. It should be also noted that the term "ground line" represents a virtual ground line and does not necessarily mean that the line is fixed to the ground level.

Next, the operation of the EEPROM array shown in FIG. 9 will be explained with reference to FIG. 10. In the case of this embodiment, the EEPROM array shown in FIG. 9 was formed by the standard 0.8 μm CMOS process. The thickness of the gate oxide film was set to 150 Å, the gate length of the PMOS and the NMOS transistors was set to 0.8 μm, and the gate capacitance ratio (Cgp/Cgn) was set to 2/3. The difference in the gate capacitance between the PMOS and the NMOS transistors was imparted by varying the gate width.

Figure 10:
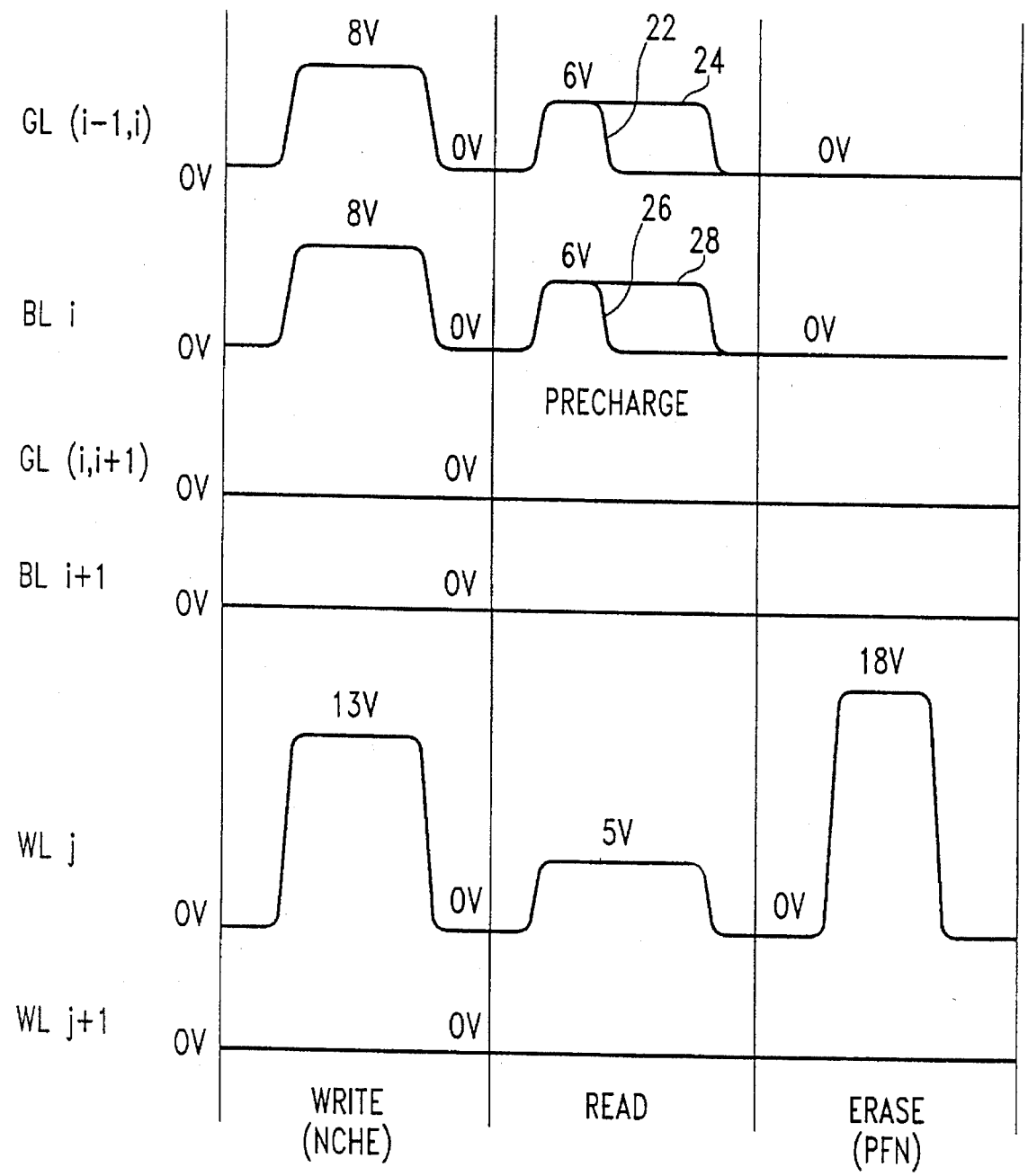
FIG. 10 is a view illustrating the operation of the EEPROM array circuit shown in FIG. 9.

FIG. 10 illustrates the write, read, and erase operations for the memory cell (i, j) L shown in FIG. 9. In this particular embodiment, data is written through the NCHE injection described with respect to FIG. 3, and data is erased through the PFN tunneling injection explained in FIG. 6. During writing, for example, 13 V is applied to the word line WLj and 8 V is applied to the bit line BLi and the ground line GL (i–1, i). Other bit lines and ground lines are held at ground level. In the memory configuration of FIG. 9, one pair of memory cells are selected by one word line and one bit line and the memory cell that will receive the ground level on its associated ground line is finally selected from within this one pair of memory cells. The ground line for the non-selected memory cell is set the same potential as the bit line in order to prevent the writing into the non-selected cell. In this example, the cell (i, j) L is selected, and its floating gate is negatively charged by NCHE injection. By this, a binary value, for example, binary 1, is written into the cell (i, j) L. As a result of this writing, a threshold voltage shift of about 5 V was obtained. The other binary value, for example, binary 0, is represented by the floating gate not being negatively charged.

During reading, the bit line BLi associated with the cell (i, j) L is precharged to 5 V. The ground line GL (i, i+1) is kept at the ground level. The ground line GL (i–1, i) is charged to 5 V and the word line WLi is charged to 5 V. The purpose of charging the ground line GL (i–1, i) associated with the memory cell (i, j) U to 5 V is to prevent the reading of data from the cell. When the floating gate of the cell (i, j) L is not negatively charged and thus a binary 0 is stored, the NMOS transistor of the cell (i, j) L is rendered conductive and the bit line BLi is discharged through this NMOS transistor (curve 26 in FIG. 10). The change in the potential of the bit line BLi is detected by the associated sense circuit. When the floating gate of the cell (i, j) L is negatively charged and thus a binary 1 is stored, the NMOS of the cell (i, j) L is not rendered conductive. The bit line BLi stays at the high level (curve 28 in FIG. 10). In case where the cell (i, ,j) L stores a binary 0 and the cell (i, j) U also stores the binary 0, the NMOS transistor of the cell (i, j) U will be rendered conductive as well when the bit line BLi is discharged. Then, the ground line GL (i–1, i) will be discharged to a low level (curve 22 in FIG. 10). However, this has no influence on the read operation. Otherwise, the ground line GL (i–1, j) stays high (curve 24 in FIG. 10).

When erasing data, the word line WLi is driven to, for example, 18 V, and the bit line and the ground line are kept at the ground level. This eliminates the charge of the floating by the PFN tunneling.

In FIG. 10, NCHE injection was used for writing and PFN tunneling for erasing. However, depending on the gate capacitance ratio, the NFN tunneling injection can be used for both writing and erasing.

The above EEPROM according to the present invention is compatible with the normal CMOS logic LSI structures. It can be formed on the same chip together with logic circuits etc., through the CMOS process without requiting any special steps. One cell can be formed with two MOS transistors. Although the EEPROM according to the present invention has a lower integration density than a stacked gate EEPROM, the present EEPROM does not give rise to any problems in terms of the chip area used since it is usually used for applications requiting relatively small storage capacity.

I claim:

1. An electrically erasable and programmable read only memory (EEPROM) cell comprising:

a first MOS transistor formed in a semiconductor substrate of a first conductivity type and having current conducting regions of a second conductivity type and a gate electrode, said first MOS transistor having a gate capacitance;

a well of said second conductivity type provided in said substrate;

a capacitor formed of a plate electrode formed on said well with an insulating layer interposed therebetween, said capacitor having a capacitance;

the gate electrode of said first MOS transistor and said plate electrode being connected in common to form a floating gate, and said well serving as a control gate;

the capacitance of said capacitor being smaller than the gate capacitance of said first MOS transistor;

said well including a region of said first coductivity type adjacent said plate electrode;

write means including a first write voltage coupleable to said well and a second write voltage coupleable to one of said current conducting regions of said first MOS transistor to cause injection of carriers into said floating gate at said first MOS transistor; and erase means including an erase voltage coupleable to a common connection of said well and said first conductivity type region and a ground voltage coupleable to a current conducting region of said first MOS transistor, whereby carriers in the floating gate are removed by FN tunnelling in the region of said plate electrode in said well.

2. An EEPROM cell according to claim 1, including a second MOS transistor formed in said well and having current conducting regions of said first conductivity type;

said at least one region of said first conductivity type serving as at least one current conducting region of said second MOS transistor; and said plate electrode serving as the gate electrode of said second MOS transistor.

3. An (EEPROM) array, comprising:

a plurality of EEPROM cells arranged in rows and columns;

a plurality of wordlines, a plurality of bit lines;

a plurality of ground lines;

each of said memory cells including a first MOS transistor formed in a semiconductor substrate of a first conductivity type and having current conducting regions of a second conductivity type and a gate electrode, said first MOS transistor having a gate capacitance;

a well of said second conductivity type provided in said substrate;

a capacitor formed of a plate electrode formed on said well with an insulating layer interposed therebetween, said capacitor having a capacitance;

the gate electrode of said first MOS transistor and said plate electrode being commonly connected to form a floating gate;

the capacitance of said capacitor being smaller than the gate capacitance of said first MOS transistor;

said well including a region of said first conductivity type adjacent said plate electrode;

write means including a first write voltage coupleable to said and a second write voltage coupleable to one of said current conducting regions of said first MOS transistor to cause injection of carriers into said floating gate at said first MOS transistor; and erase means including an erase voltage coupleable to a common connection of said well and said first conductivity type region and a ground voltage coupleable to a current conducting region of said first MOS transistor, whereby carriers in the floating gate are removed by FN tunnelling in the region of said plate electrode in said well said word lines being provided one for each of said cell rows each commonly connected to said wells and said regions of said first conductivity type in its associated cell row;

each of at least some of said bit lines being shared by a pair of cell columns and commonly connected to one current conducting regions of said first MOS transistors in its associated pair of cell columns;

each of at least some of said ground lines being shared by a pair of cell columns connected to different bit lines and commonly connected to the other current conducting regions of said first MOS transistors in its associated pair of cell columns; and said array further comprising:
word line potential control means connected to said word lines, bit line potential control and sense means connected to said bit lines; and ground line potential control means connected to said ground lines.

4. An EEPROM array according to claim 3 wherein each said memory cell includes a second MOS transistor formed in said well and having current conducting regions of said first conductivity type;

said at least one region of said first conductivity type serves as at least one current conducting region of said second MOS transistor; and said plate electrode serves as the gate electrode of said second MOS transistor.

5. A CMOS logic LSI chip having a logic circuit, said chip including an array of a plurality of EEPROM cells arranged in rows and columns in a portion of the region thereof, each of said cells comprising:

a first MOS transistor formed in a semiconductor substrate of a first conductivity type and having current conducting regions of a second conductivity type and a gate electrode said first MOS transistor having a gate capacitance;

a well of said second conductivity type provided in said substrate; and a capacitor formed of a plate electrode formed on said well with an insulating layer interposed therebetween, said capacitor having a capacitance;

the gate electrode of said first MOS transistor and said plate electrode being connected in common to form a floating gate; and said well serving as a control gate;

the capacitance of said capacitor being smaller than the gate capacitance of said first MOS transistor;

said well including a region of said first conductivity type adjacent said plate electrode;

write means including a first write voltage coupleable to said well and a second write voltage coupleable to one of said current conducting regions of said first MOS transistor to cause injection of carriers into said floating gate at said first MOS transistor; and erase means including an erase voltage coupleable to a common connection of said well and said first conductivity type region and a ground voltage coupleable to a current conducting region of said first MOS transistor, whereby carriers in the floating gate are removed by FN tunnelling in the region of said plate electrode in said well.

6. A logic LSI chip according to claim 5, including a second MOS transistor formed in said well and having current conducting regions of said first conductivity type;

said at least one region of said first conductivity type serving as at least one current conducting region of said second MOS transistor; and said plate electrode serving as a gate electrode of said second MOS transistor.

7. An EEPROM cell according to claim 1, further comprising read means including a first read voltage coupleable to said well and said first conductivity type region and a second read voltage coupleable to one of said current conducting regions of said first MOS transistor.

8. An EEPROM array according to claim 1, wherein the cell comprises only one well of a first conductivity type having a plate electrode and a diffusion of a first conductivity type.

9. An EEPROM array according to claim 3, wherein said erase means comprises one of said lines coupled to said erase voltage and said ground voltage coupled to said bit ground lines of all columns, so as to provide a row by row erase.

* * * * *